United States Patent
Han et al.

(10) Patent No.: US 11,324,116 B2
(45) Date of Patent: May 3, 2022

(54) FLEXIBLE PRINTED CIRCUITS FOR USB 3.0 INTERCONNECTS IN MOBILE DEVICES

(71) Applicant: QUALCOMM Incorporated, San Diego, CA (US)

(72) Inventors: Guobing Han, Shanghai (CN); Jianxiang Wu, San Diego, CA (US); Cooper Xie, Shanghai (CN); Wei Yan, Shanghai (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/613,785

(22) PCT Filed: Jun. 12, 2017

(86) PCT No.: PCT/CN2017/087877
§ 371 (c)(1),
(2) Date: Nov. 14, 2019

(87) PCT Pub. No.: WO2018/227324
PCT Pub. Date: Dec. 20, 2018

(65) Prior Publication Data
US 2020/0084887 A1    Mar. 12, 2020

(51) Int. Cl.
*H05K 1/03* (2006.01)
*H05K 1/02* (2006.01)
(Continued)

(52) U.S. Cl.
CPC ......... *H05K 1/0393* (2013.01); *H05K 1/0219* (2013.01); *H05K 1/148* (2013.01);
(Continued)

(58) Field of Classification Search
CPC .... H05K 1/0393; H05K 1/0219; H05K 1/148; H05K 3/361; H05K 5/0278; H05K 2201/0154
See application file for complete search history.

(56) References Cited

U.S. PATENT DOCUMENTS 6,224,395 B1 * 5/2001 Dahlen ................. H05K 1/028
439/67
6,294,317 B1 * 9/2001 Calistri-Yeh ......... B41J 2/14129
347/20
(Continued)

FOREIGN PATENT DOCUMENTS

| CN | 1734843 A | 2/2006 |
| CN | 102307428 A | 1/2012 |

(Continued)

OTHER PUBLICATIONS

International Search Report and Written Opinion—PCT/CN2017/087877—ISA/EPO—dated Mar. 15, 2018.
(Continued)

*Primary Examiner* — Ishwarbhai B Patel
(74) *Attorney, Agent, or Firm* — Holland & Hart LLP (57) ABSTRACT

Systems, apparatus, methods for manufacturing and techniques for interconnecting integrated circuit devices are disclosed. A flexible printed circuit (FPC) provides EMI shielding with reduced insertion loss. The FPC includes a first signal layer fabricated from a planar conductive material and having traces configured to carry signals between a circuit boards. The FPC may include a first non-conductive layer disposed in a plane above the first signal layer, a second non-conductive layer disposed in a plane below the first signal layer, a first copper ground plane disposed in a plane above the first non-conductive layer, a second copper ground plane disposed in a plane below the second non-conductive layer, and a second signal layer provided in a
(Continued)

plane above the first copper ground plane or below the second copper ground plane. Signals carried in the first signal layer may have a higher frequency than signals carried in the second signal layer.

22 Claims, 8 Drawing Sheets

(51) Int. Cl.
    *H05K 1/18*     (2006.01)
    *H05K 1/14*     (2006.01)
    *H05K 3/36*     (2006.01)
    *H05K 5/02*     (2006.01)
    *H05K 1/11*     (2006.01)

(52) U.S. Cl.
    CPC ........... *H05K 3/361* (2013.01); *H05K 5/0278* (2013.01); *H05K 1/118* (2013.01); *H05K 1/18* (2013.01); *H05K 1/189* (2013.01); *H05K 2201/0154* (2013.01)

(56) References Cited

U.S. PATENT DOCUMENTS

| | | | | |
|---|---|---|---|---|
| 7,292,449 B2* | 11/2007 | Hall | ..................... | H05K 1/0231 174/110 R |
| 10,039,192 B1* | 7/2018 | Hu | ..................... | H05K 1/148 |
| 2006/0035487 A1* | 2/2006 | Maskatia | ..................... | H01R 27/02 439/67 |
| 2006/0060956 A1* | 3/2006 | Tanikella | ..................... | H01L 21/4857 257/686 |
| 2007/0102092 A1 | 5/2007 | Dangler et al. | | |
| 2009/0133906 A1* | 5/2009 | Baek | ..................... | H05K 1/0218 174/254 |
| 2009/0188712 A1* | 7/2009 | Clark | ..................... | H05K 1/0219 174/378 |
| 2009/0190322 A1* | 7/2009 | Kojima | ..................... | H01Q 1/243 361/827 |
| 2012/0228006 A1* | 9/2012 | Chen | ..................... | H05K 1/0219 174/251 |
| 2014/0376199 A1* | 12/2014 | Kato | ..................... | H05K 1/144 361/753 |
| 2015/0042421 A1* | 2/2015 | Kato | ..................... | B32B 37/12 333/238 |
| 2015/0054600 A1* | 2/2015 | Sasaki | ..................... | H01P 3/085 333/238 |
| 2016/0156087 A1* | 6/2016 | Baba | ..................... | H01P 3/085 333/238 |
| 2016/0205766 A1 | 7/2016 | Blum et al. | | |
| 2017/0358847 A1* | 12/2017 | Cho | ..................... | H01R 12/79 |

FOREIGN PATENT DOCUMENTS

| | | |
|---|---|---|
| CN | 203896584 U | 10/2014 |
| CN | 205385649 U | 7/2016 |
| CN | 205564941 U | 9/2016 |
| CN | 106602193 A | 4/2017 |

OTHER PUBLICATIONS

Supplementary European Search Report—EP17914007—Search Authority—The Hague—dated Dec. 9, 2020.

* cited by examiner

FLEXIBLE PRINTED CIRCUITS FOR USB 3.0 INTERCONNECTS IN MOBILE DEVICES

CROSS-REFERENCE TO RELATED APPLICATION(S)

This application is the U.S. national stage application of PCT patent application number PCT/CN2017/087877 filed on Jun. 12, 2017, the content of which is incorporated herein by reference and for all purposes.

TECHNICAL FIELD

The present disclosure relates generally to apparatus and methods for interconnecting integrated circuit devices, and more particularly for interconnecting integrated circuit devices within mobile devices.

BACKGROUND

Electronic communication and computational devices may include a variety of components including circuit boards, integrated circuit (IC) devices and/or System-on-Chip (SoC) devices. SoC devices, and other IC devices, perform increasingly complex functions using distinct functional modules and/or circuits. Increased functionality can drive demand for input/output (I/O) pins and connectors in IC devices and can result in increased interconnection complexity due in part to increased signaling frequencies.

In many instances, interconnections between IC devices, and/or between IC devices and a serial bus such as a universal serial bus (USB) may include some combination of wires, traces or connectors that carry high-frequency signals, wires, traces or connectors that carry low-frequency signals and direct current (DC) connections. Electromagnetic interference (EMI) issues can be more pronounced at higher signaling frequencies. Coexistence of high-frequency signals with other signals and wires may require the use of EMI shielding, which can attenuate the high-frequency signals and/or the low-frequency signals. Conventionally, signals received from an EMI-shielded interconnect require amplification or re-driving to overcome the effects of the EMI shielding.

As design of communication and computational devices continue to increase in complexity and include a greater level of communications capability, there is a continual need for improved solutions for interconnecting IC devices.

SUMMARY

Certain aspects of the disclosure relate to systems, apparatus, methods and techniques for interconnecting IC devices using a flexible printed circuit (FPC) that provides EMI shielding with reduced insertion loss.

In various aspects of the disclosure, a flexible printed circuit includes a first signal layer fabricated from a planar conductive material and having one or more traces formed therein, each of the one or more traces in the first signal layer being configured to carry a signal between a first circuit board and a second circuit board. The FPC may include a first non-conductive layer disposed in a plane above the first signal layer, a second non-conductive layer disposed in a plane below the first signal layer, a first copper ground plane disposed in a plane above the first non-conductive layer, a second copper ground plane disposed in a plane below the second non-conductive layer, and a second signal layer provided in a plane above the first copper ground plane or below the second copper ground plane. Signals carried in the first signal layer may include higher frequency components than signals carried in the second signal layer.

In one aspect one or more signals carried in the first signal layer are sourced from an IC device provided on the first circuit board and transmitted unamplified through a connector provided on the second circuit board. The IC may include a modem, and/or an application processor. The connector provided on the second circuit board may be a USB connector. The first non-conductive layer may be formed from a material that comprises a polyimide. The second signal layer may be provided in a plane above the first copper ground plane and separated from the first copper ground plane by a third non-conductive layer formed from a material that comprises a polyimide.

In one aspect, the FPC may be constructed from a plurality of multi-layer components. Adjacent multi-layer components may be bonded together by adhesive.

In one example, the first signal layer may carry a signal having a frequency of at least 5 GHz. In another example, the first signal layer may carry a signal having a frequency of between 1 GHz and 5 GHz.

In various aspects of the disclosure, a method for constructing a flexible printed circuit includes fabricating a first signal layer from a planar conductive material such that the first signal layer has one or more traces formed therein. Each of the one or more traces in the first signal layer may be configured to carry a signal between a first circuit board and a second circuit board. The method may include providing a first copper ground plane in a plane above the first signal layer, providing a second copper ground plane in a plane below the first signal layer, and fabricating a second signal layer from a planar conductive material disposed in a plane above the first copper ground plane such that the second signal layer has one or more traces formed therein. The flexible printed circuit is adapted to shield signals in the second signal layer from electromagnetic interference produced by higher frequency components of signals carried in the first signal layer.

In one aspect, the FPC may be configured to carry one or more signals in the first signal layer from an integrated circuit provided on the first circuit board to be transmitted unamplified through a connector provided on the second circuit board. The IC may include a modem. The IC may include an application processor. The connector provided on the second circuit board may be a USB connector. The first non-conductive layer may be formed from a material that comprises a polyimide.

In one aspect, the first signal layer is separated from the first copper ground plane by a first non-conductive layer formed from a material that comprises a polyimide. The flexible printed circuit may be constructed from a plurality of multi-layer components, where adjacent multi-layer components are bonded together by adhesive.

In certain aspects, fabricating the first signal layer includes providing at least one ground trace adjacent to the one or more traces configured to carry a signal between the first circuit board and the second circuit board.

In one aspect, the FPC is adapted to carry a signal in the first signal layer that has a frequency of at least 5 GHz. In another example, the FPC is adapted to carry a signal in the first signal layer that has a frequency of between 1 GHz and 5 GHz.

In various aspects of the disclosure, an apparatus has an IC device mounted on a first circuit board, a connector mounted on a second circuit board that is physically separate from the first circuit board, and a flexible printed circuit configured to couple the first circuit board to the second circuit board. The IC device may include a modem and/or an application processor. The connector may be a USB connector.

In certain aspects, the flexible printed circuit includes a first signal layer fabricated from a planar conductive material and having one or more traces formed therein each configured to carry one or more signals transmitted by the IC device to the connector, a first non-conductive layer disposed in a plane above the first signal layer, a second non-conductive layer disposed in a plane below the first signal layer, a first copper ground plane disposed in a plane above the first non-conductive layer, a second copper ground plane disposed in a plane below the second non-conductive layer, and a second signal layer provided in a plane above the first copper ground plane or below the second copper ground plane. The one or more signals carried in the first signal layer may include higher frequency components than signals carried in the second signal layer. The one or more signals carried in the first signal layer are transmitted unamplified through the connector.

In some examples, the first non-conductive layer is formed from a material that comprises a polyimide. The second signal layer may be provided in a plane above the first copper ground plane and separated from the first copper ground plane by a third non-conductive layer formed from a material that comprises a polyimide.

In one aspect, the flexible printed circuit may be constructed from a plurality of multi-layer components, where adjacent multi-layer components are bonded together by adhesive.

In one example, the FPC is adapted to carry a signal in the first signal layer that has a frequency of at least 5 GHz. In another example, the FPC is adapted to carry a signal in the first signal layer that has a frequency of between 1 GHz and 5 GHz.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Overview

Certain aspects described herein relate to an apparatus that include interconnects used to communicate high-frequency signals between IC devices. For example, mobile telephones and tablet computing devices may include a flexible printed circuit (FPC) that serves as a bridge or interconnect. One design objective of the FPC is to provide a communication channel with a small enough insertion loss to permit a receiver to correctly receive and decode signals. Another design objective of the FPC is to ensure low radiation in order to avoid interfering with other signals and subsystems. In some instances, the FPC is used to connect a Mobile Station Modem/Central Processing Unit (MSM/CPU) chipset to a universal serial bus USB 3.0 connector assembly, which can have a length of between 80-100 mm or more. In conventional systems, layers of an FPC that carry high-frequency signals are enclosed by EMI protection layers to reduce interfering radiation. The EMI layers can add additional large insertion losses to the USB channel for data signaling rates of 5 Gb/s or higher. In conventional implementations, an expensive high data-rate re-driver is used to compensate for the insertion losses attributable to the EMI layers.

Certain aspects of this disclosure provide a novel FPC structure that does not include EMI layers and has a low insertion loss.

Example of Apparatus That May Include Interconnects Between IC Devices

According to certain aspects, FPC bridges may be employed in a variety of processing systems, and may be used to interconnect IC devices embedded in various devices, vehicles, appliances, manufacturing equipment and other equipment. For example, certain components of the processing systems may be incorporated in SoCs that are subcomponents of an apparatus such as a cellular phone, a smart phone, a session initiation protocol (SIP) phone, a server, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Figure 1:
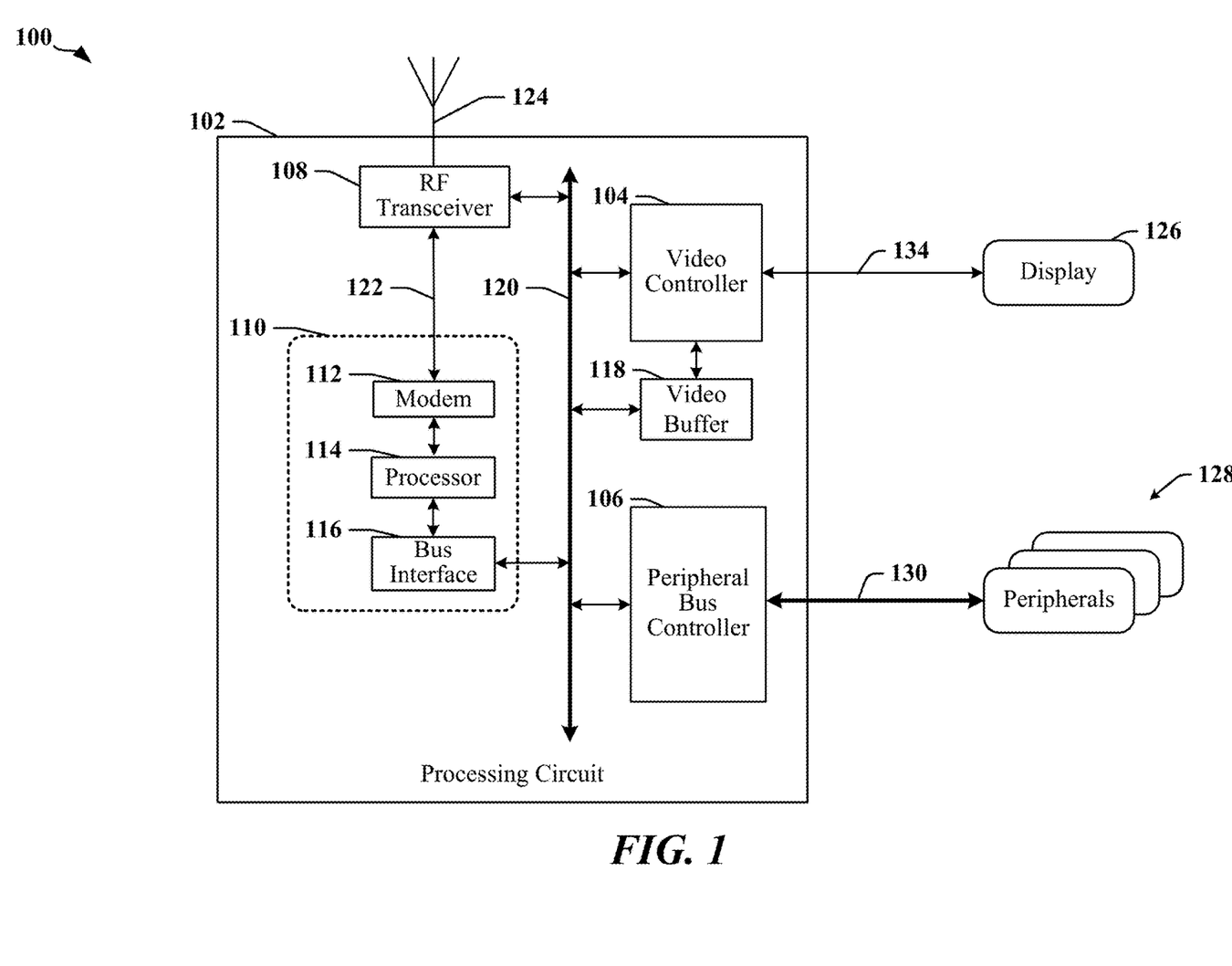
FIG. 1 illustrates an example of an apparatus that may include interconnecting communication links provided between physically distinct devices.

FIG. 1 illustrates an example of an apparatus 100 that may include interconnecting communication links provided between physically distinct devices. The apparatus 100 may include a processing circuit 102 having multiple circuits or devices 104, 106, 108, 110 and/or 118, which may be implemented in one or more ASICs, including an SoC. In one example, the apparatus 100 may perform communication, navigation, control/instrumentation display and/or entertainment functions. The processing circuit 102 may include one or more processors 114, peripheral controllers 106 adapted to manage, configure and/or control one or more peripheral devices 128, 130, and a transceiver 108 that enables the apparatus to communicate through an antenna 124 with a local network, a Bluetooth network, a radio access network, a core access network, the Internet and/or another network. In one example, the processing circuit 102 may include an ASIC or SoC 110 that includes one or more modems 112, a bus interface circuit 116 and/or other logic circuits or functions including on-board storage.

The processing circuit 102 may be controlled by one or more operating systems that may provide an application programming interface (API) layer that enables the one or more processors 114 to execute software modules residing in the on-board storage or other processor-readable storage (including the video buffer 118) that may be provided on the processing circuit 102. The processing circuit 102 may also have access to storage internal and/or external to the processing circuit 102. The software modules may include instructions and data stored in the on-board storage or other storage. The Storage may be implemented using read-only memory (ROM) or random-access memory (RAM), electrically erasable programmable ROM (EEPROM), flash cards, or any memory device that can be used in processing systems and computing platforms. The processing circuit 102 may include, implement, or have access to a local database, look-up tables or other parameter storage that can maintain operational parameters and other information used to configure and operate the apparatus 100 and/or the processing circuit 102. The local database and/or look-up tables may be implemented using registers, a database module, flash memory, magnetic media, EEPROM, soft or hard disk, or the like. The processing circuit 102 may also be operably coupled to external devices such as the antenna 124, among other peripheral devices 128, 130, and/or to one or more connectors 126 through communication interface 104. The communication interface 104 may be adapted to manage, and/or configure communications through the one or more connectors 126, through a dedicated communication link 134, which may include FPC interconnects, for example.

The processing circuit 102 may provide one or more buses 120, 122 that enable certain devices 104, 106, 108, 110, 112, 114, 116 and/or 108 to communicate with one another. The processing circuit 102 may include or control a power management function that configures and manages the operation of the apparatus 100.

Figure 2:
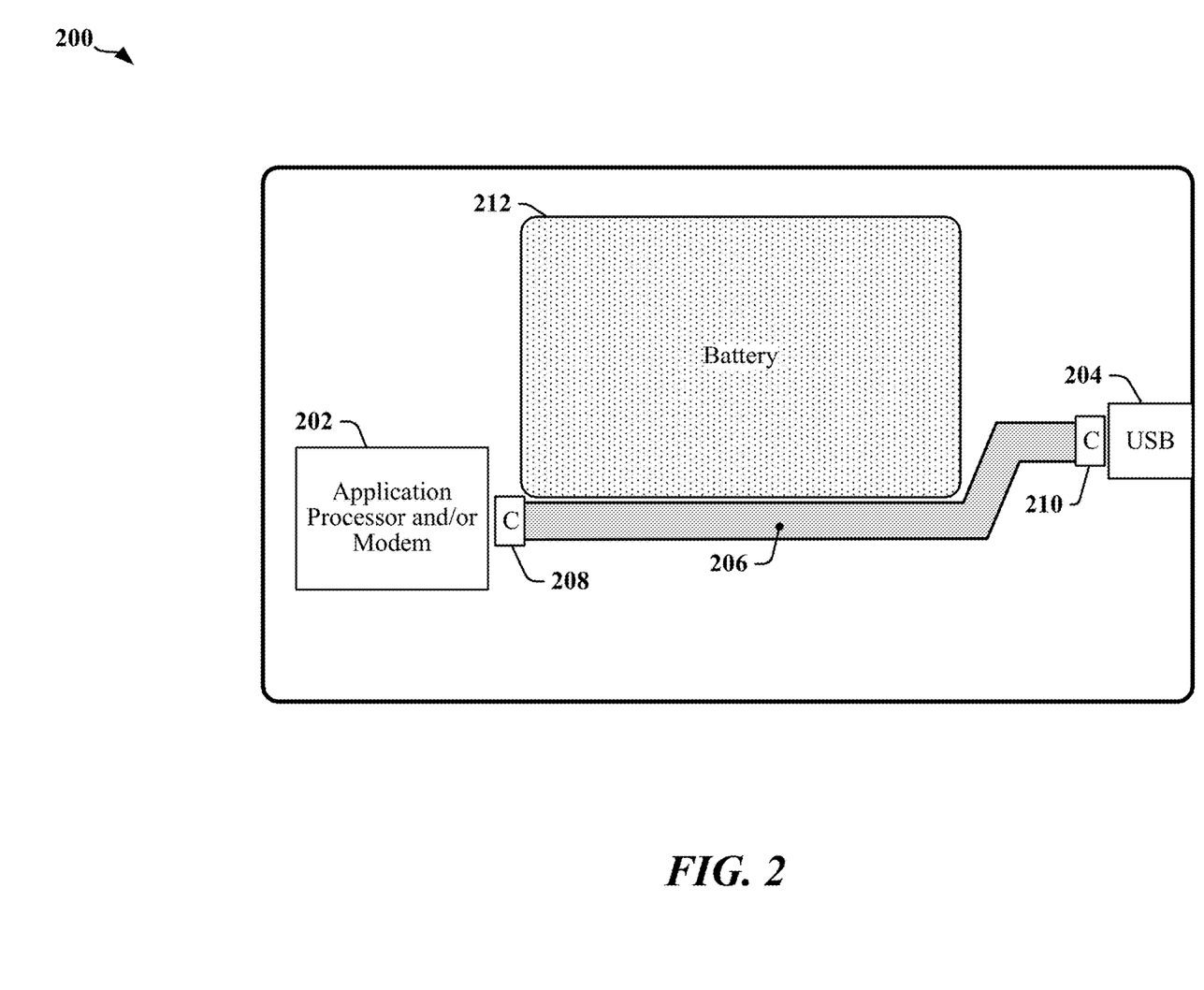
FIG. 2 illustrates an example of an apparatus that includes a bridging FPC interconnect.

FIG. 2 illustrates an example of an apparatus 200 that includes a bridging FPC interconnect 206. The FPC interconnect 206 may follow a circuitous route from an application processor and/or modem 202 to a USB 3.0 connector 204. The FPC interconnect 206 may be coupled at one end to the application processor and/or modem 202 through a first FPC connector 208 and to the USB 3.0 connector 204 through a second FPC connector 210, and/or a circuit board on which the USB connector 204 is mounted. The FPC interconnect 206 may be routed around other components of the apparatus 200, such as the battery 212 depicted in the illustrated example. In conventional systems, the circuit board that mounts the USB 3.0 connector 204 may include a re-driver that compensates for insertion loss associated with the FPC interconnect 206 by amplifying signals received from the FPC interconnect 206.

Figure 3:
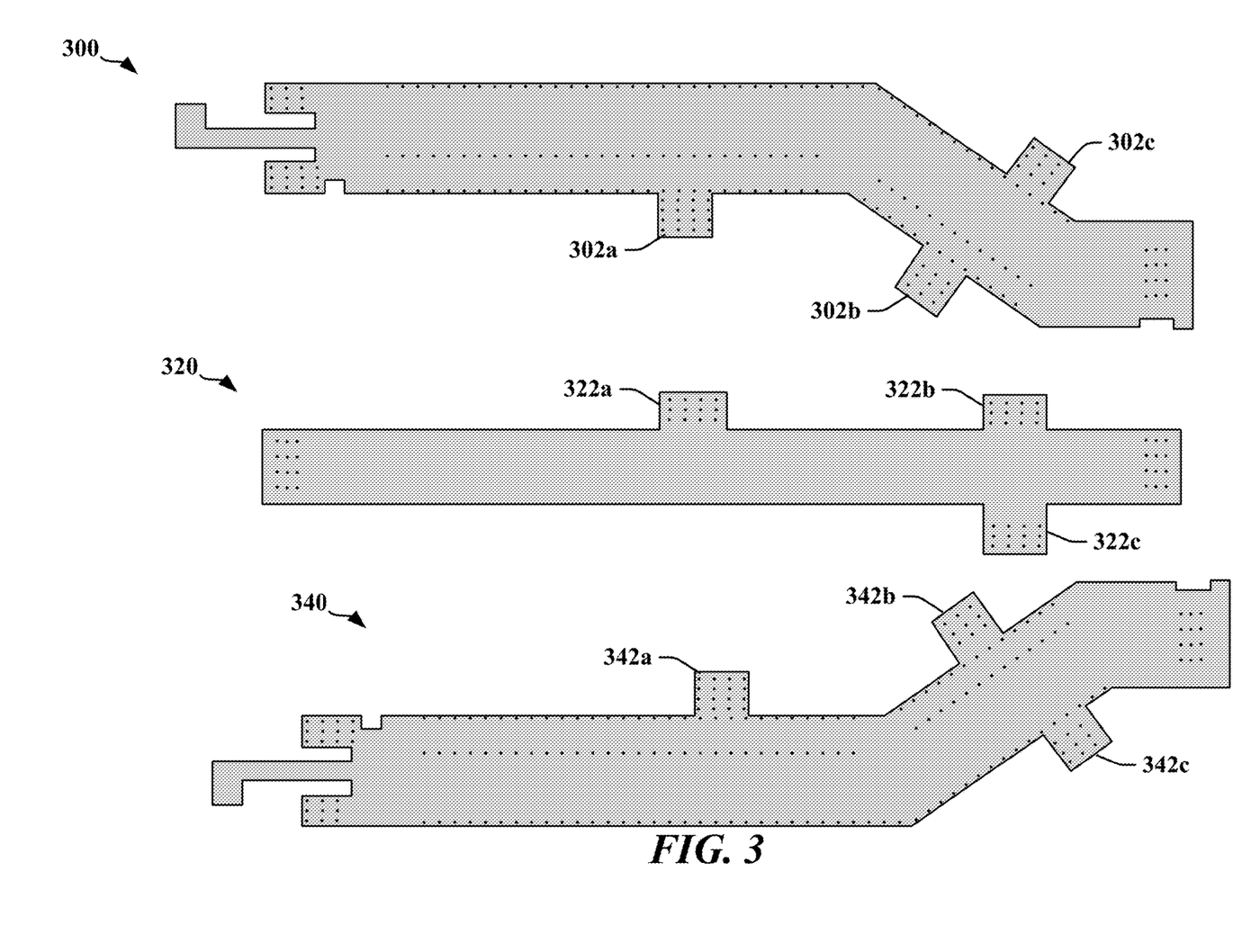
FIG. 3 includes examples of differently configured FPC interconnects.

FIG. 3 includes examples of differently configured FPC interconnects 300, 320, 340.

The shape of the FPC interconnects 300, 320, 340 may be determined by physical arrangement of components within an apparatus. The location of a number of tabs 302a-302c, 322a-322c, 342a-342c on the FPC interconnects 300, 320, 340 may be determined by physical location of IC devices coupled through the FPC interconnects 300, 320, 340.

Insertion Loss In FPC Interconnects

Figure 4:
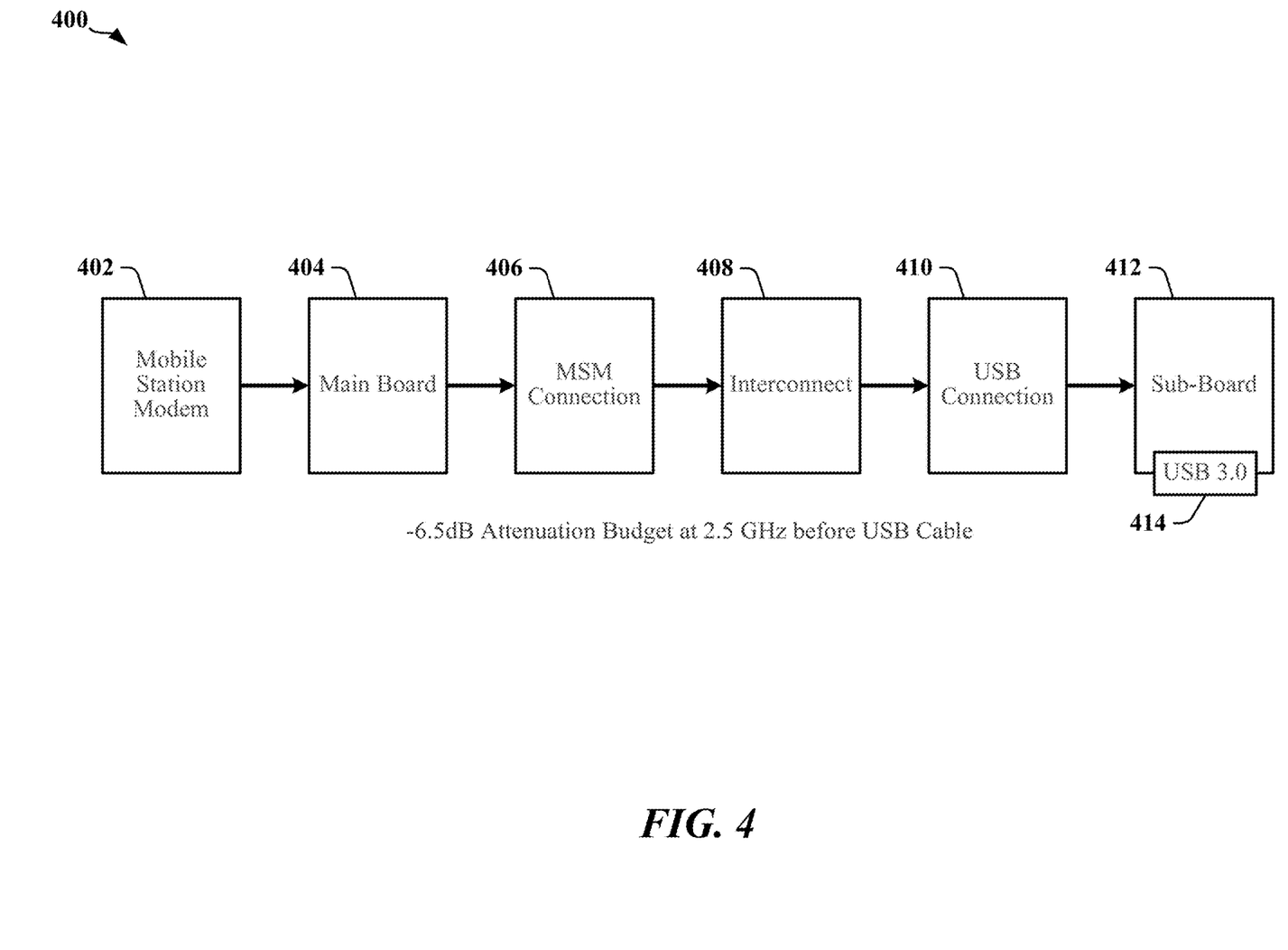
FIG. 4 is a block diagram that illustrates certain interconnections that may contribute to end-to-end attenuation in an apparatus.

Insertion loss in an FPC interconnect may be defined as the loss of signal power resulting from the insertion of the FPC interconnect between a pair of IC devices to provide a bridging interconnect. FIG. 4 illustrates certain interconnections that may contribute to end-to-end attenuation in an apparatus 400. The apparatus 400 includes features that corresponds to certain features of the apparatus 200 illustrated in FIG. 2. A host device 402 which may be an MSM, an application processor, or the like, is coupled to a USB 3.0 connector 414. The host device 402 is typically mounted on a main board 404 and coupled through a first connection system 406. The first connection system 406 may include a connector mounted on the main board 404 which is adapted to mate with a corresponding connector attached to the FPC bridge 408. The USB 3.0 connector 414 may be mounted on a sub-board 412 that includes a second connection system 410. The second connection system 410 may include a connector mounted on the sub-board 412 and adapted to mate with a corresponding connector attached to the FPC bridge 408. Each component 404, 406, 408, 410, 412 inserted between the host device 402 and the USB 3.0 connector 414 is associated with an insertion loss. The sum of the insertion losses may affect the ability of a receiver to distinguish between signaling states and or detect transitions in signals. An attenuation budget may be assigned for coupling the host device 402 to the USB 3.0 connector 414, where the attenuation budget may define maximum signal attenuation based on signal power required to be presented at the USB 3.0 connector 414.

Figure 5:
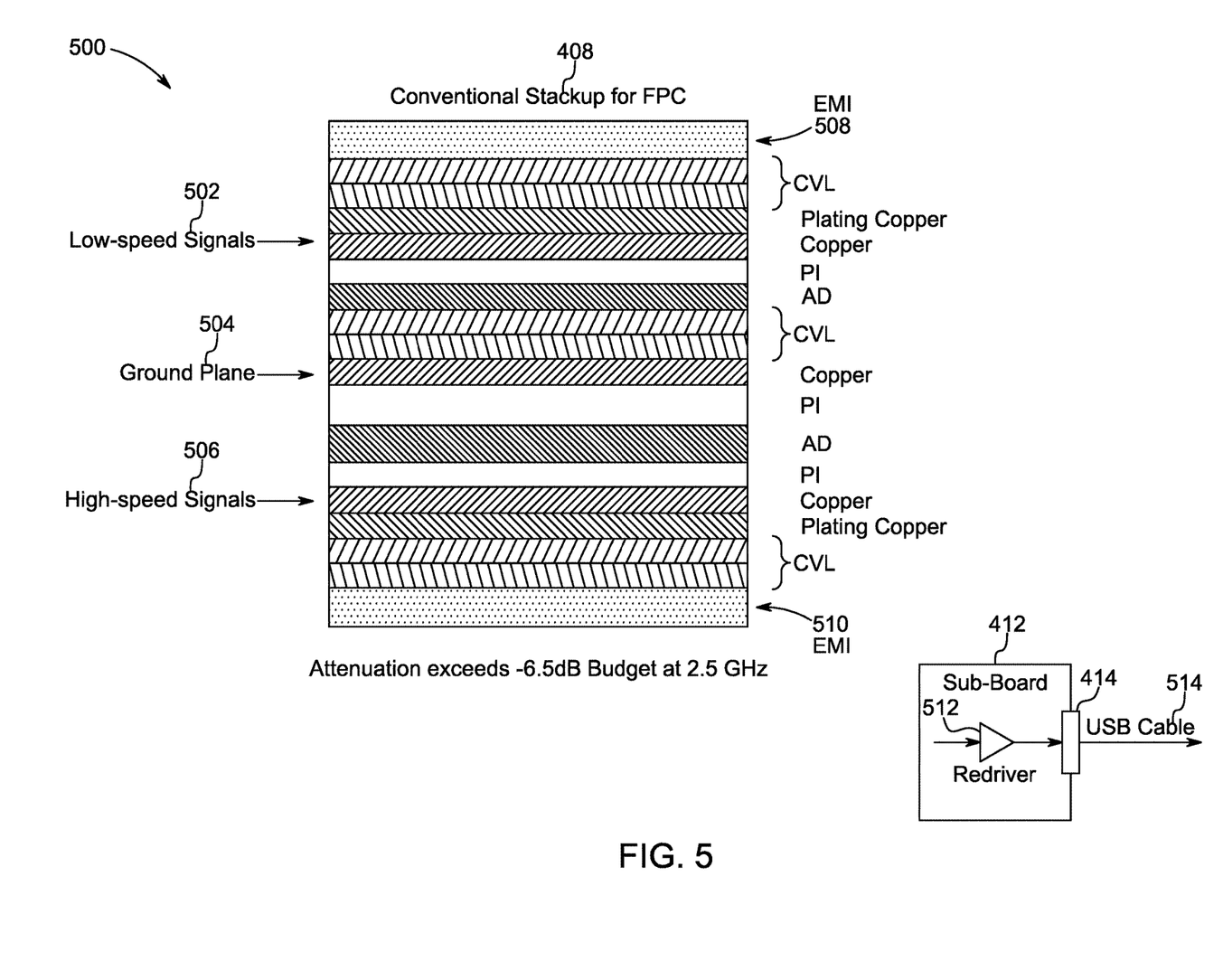
FIG. 5 illustrates a conventional stacking of layers in an FPC bridge with EMI layers that block or prevent EMI.

The FPC bridge 408 can be a major contributor to attenuation observed between the host device 402 and the USB 3.0 connector 414. The FPC bridge 408 may have a length in the range 80-100 mm or more, with attenuation increasing with length of the FPC bridge 408. The FPC bridge 408 may include EMI shielding provided as conductive layers provided about high-frequency signals. FIG. 5 illustrates a conventional stacking 500 of layers in an FPC bridge 408 in which EMI layers 508, 510 are added to block or prevent EMI produced by high-speed signals carried by the FPC bridge 408. As illustrated, the FPC bridge 408 may include a conductive ground plane deployed between the high-speed signals and low-speed signals. Each layer 504, 508, 510 contributes to the capacitance/admittance of the wires in the layers 506 that carries high-speed signals and of the wires in the layer 502 that carries low-speed signals.

The layers 504, 508, 510 contribute to the capacitance/admittance per unit length of the wires in layers 506 that carry the high-frequency signals. The attenuation associated with capacitance/admittance per unit length increases with signaling frequency, and an FPC bridge 408 that can carry signals with 1 GHz frequency components may be unable to handle signals with 2.5 GHz or 5 GHz frequency components because the attenuation of 2.5 GHz or 5 GHz components may exceed the attenuation budget associated with the FPC bridge 408. In conventional systems, a re-driver circuit is included in the sub-board 412 that carries the USB 3.0 connector 414, which receives a mating connector of a USB cable 514.

FPC Structure Example Without EMI Layers

Figure 6:
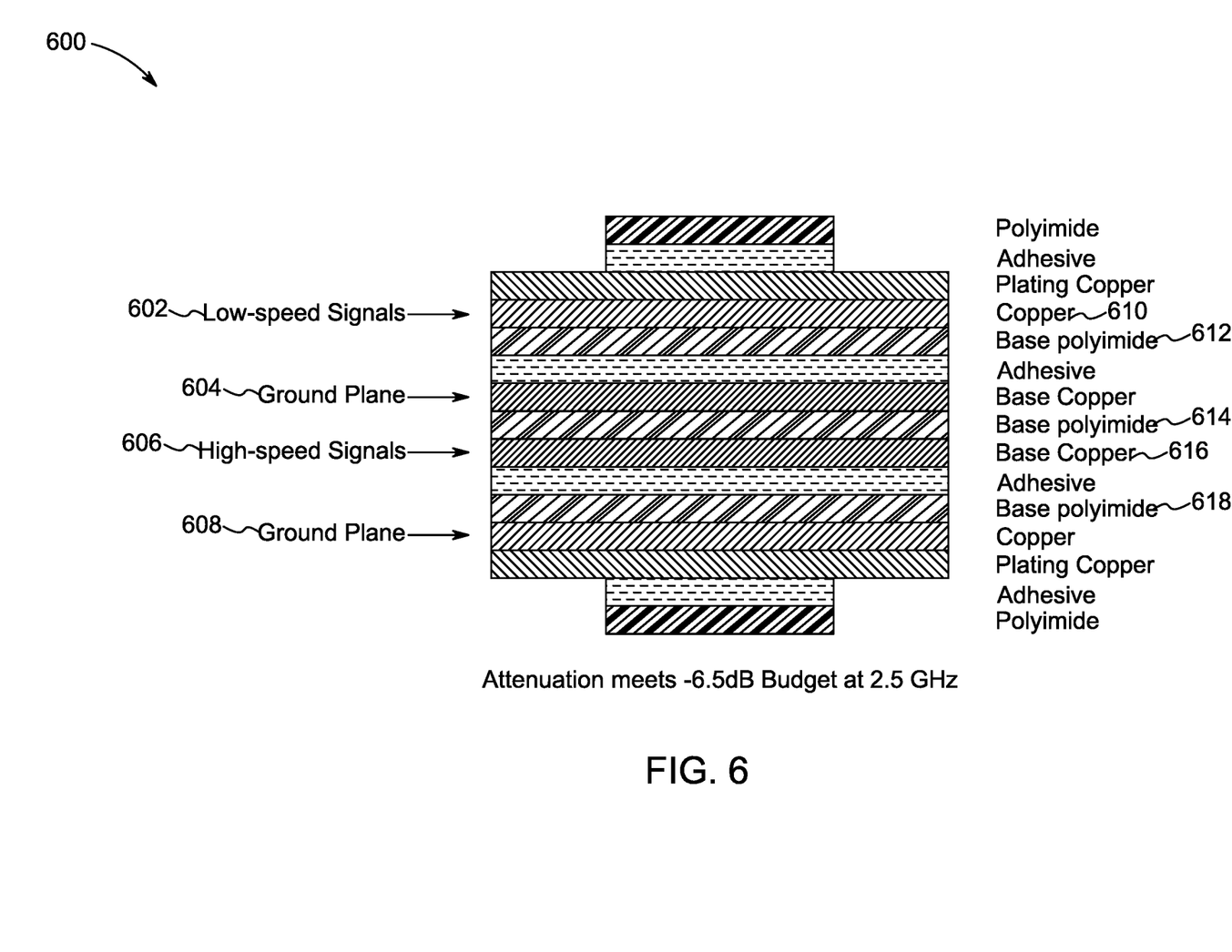
FIG. 6 is a cross-sectional view of an example of an improved low insertion-loss and FPC bridge without EMI layers in accordance with certain aspects disclosed herein.

FIG. 6 is a cross-sectional view of an example of an EMI-shielded FPC bridge 600 that may be implemented using a layered structure that does not include EMI shielding layers in accordance with certain aspects disclosed herein. The exclusion or removal of EMI shielding layers can provide a lower insertion loss for the FPC bridge than conventional FPC implementations that have EMI shielding layers. The wires or traces in a signal layer 606 that carries high-frequency signals (e.g., greater than 2.5 GHz), as well as wires or traces in a lower-frequency signal layer 602, have a reduced capacitance/admittance per unit length with respect to wires or traces in layers 502, 506 of conventional FPC bridges.

In the example illustrated in FIG. 6, the signal layer 606 that carries high-frequency signals is disposed between a pair of ground planes 604, 608 that provide EMI shielding for the signal layer 606. One ground plane 604 is provided between the signal layers 602, 606 and the interposed ground plane 604 can reduce or eliminate EMI induced in lower-frequency signals carried in the signal layer 602 by the higher-frequency signals carried in the signal layer 606 (and vice versa).

Figure 7:
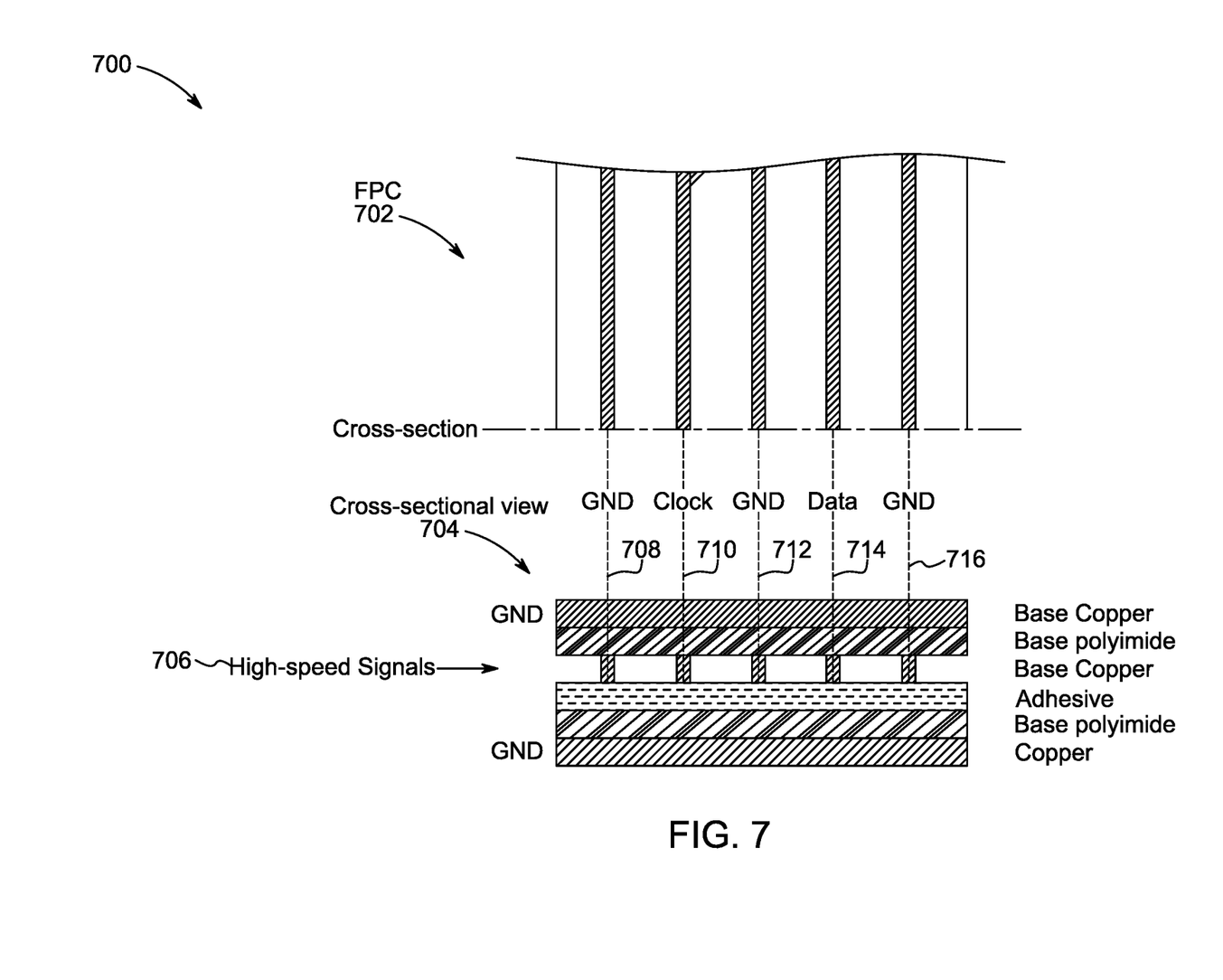
FIG. 7 provides additional views of a portion of the EMI-shielded FPC bridge of FIG. 6.

FIG. 7 is a drawing that provides additional views 702, 704 of a portion 700 of the EMI-shielded FPC bridge 600 of FIG. 6. The ground planes 604, 608 and the signal layer 606 for higher-frequency signals are illustrated. Multiple, wires or traces 708, 710, 712, 714, 716 may be provided in a layer that is fabricated to carry one or more signals 706. EMI shielding may be enhanced when signal-carrying wires or traces 710, 714 are provided between wires or traces 708, 712, 716 coupled to signal ground and/or a DC power supply. In the example, the high-speed signals may include a wire or trace 710 that carries a clock signal of a serial bus and a wire or trace 714 that carries data signal of the serial bus.

The elimination or omission of EMI shielding layers in the EMI-shielded FPC bridge 600 of FIG. 6 may be associated with a significantly reduced insertion loss with respect to conventional FPC bridges that have dedicated EMI shielding layers. In many instances, the reduction in insertion loss permits the EMI-shielded FPC bridge 600 to be used in applications where signals may be transmitted without amplification through a USB 3.0 connector. The reduction in insertion loss permits the EMI-shielded FPC bridge 600 to be used without a re-driver circuit such as the re-driver circuit 512 illustrated in FIG. 5, which represents conventional FPC bridges.

Additional Descriptions Of Certain Aspects Of The Disclosure

With continued reference to FIGS. 4, 6 and 7, a flexible printed circuit may include a first signal layer 606 fabricated from a planar conductive material 616. The first signal layer 606 may have one or more wires or traces 708, 710, 712, 714, 716 formed in the planar conductive material 616. Each of the wires or traces 708, 710, 712, 714, 716 may be configured to carry a signal between a first circuit board (main board 404) and a second circuit board (sub-board 412). The flexible printed circuit may include a first non-conductive layer 614 disposed in a plane above the first signal layer 606, a second non-conductive layer 618 disposed in a plane below the first signal layer 606, a first copper ground plane 604 disposed in a plane above the first non-conductive layer 614, a second copper ground plane 608 disposed in a plane below the second non-conductive layer 618, and a second signal layer 602 provided in a conductive plane 610 above the first copper ground plane 604 or below the second copper ground plane 608. The signals carried in the first signal layer 606 may include higher frequency components than signals carried in the second signal layer 602.

One or more signals carried in the first signal layer 606 are sourced from an integrated circuit provided on the first circuit board (main board 404) and transmitted unamplified through a connector 414 provided on the second circuit board (sub-board 412). The integrated circuit may include a modem. The integrated circuit may include an application processor. In one example, the connector 414 provided on the second circuit board (sub-board 412) may be a USB 3.0 connector.

The second signal layer 602 may be provided in a plane 610 above the first copper ground plane 604 and separated from the first copper ground plane 604 by a third non-conductive layer 612. One or more non-conductive layers 612, 614, 618 may be formed from a polyimide material.

In one example, the flexible printed circuit is constructed from a plurality of multi-layer components, where adjacent multi-layer components are bonded together by adhesive.

In some instances, the first signal layer 606 carries a signal having a frequency of at least 5 GHz. In other instances, the first signal layer 606 carries a signal having a frequency of between 1 GHz and 5 GHz.

Figure 8:
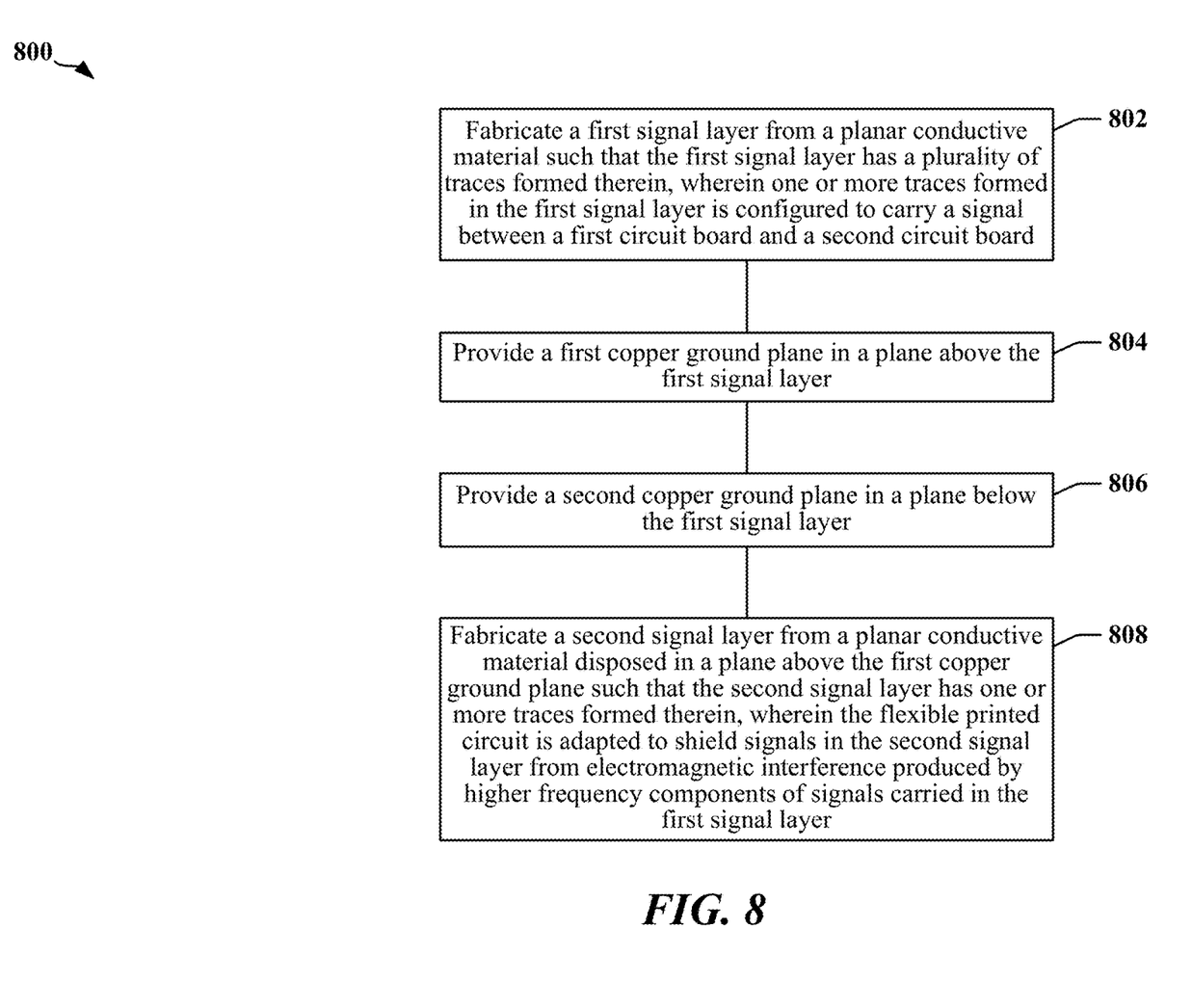
FIG. 8 is a flowchart of a method for manufacturing an FPC in accordance with certain aspects disclosed herein.

FIG. 8 is a flowchart 800 of a method for manufacturing an FPC that may be used to interconnect IC devices in an apparatus.

At block 802, a first signal layer may be fabricated from a planar conductive material such that the first signal layer has a plurality of traces formed therein. One or more traces formed in the first signal layer is configured to carry a signal between a first circuit board and a second circuit board.

At block 804, a first copper ground plane may be provided in a plane above the first signal layer.

At block 806, a second copper ground plane may be provided in a plane below the first signal layer.

At block 808, a second signal layer may be fabricated from a planar conductive material disposed in a plane above the first copper ground plane such that the second signal layer has one or more traces formed therein, wherein the flexible printed circuit is adapted to shield signals in the second signal layer from electromagnetic interference produced by higher frequency components of signals carried in the first signal layer.

In some examples, the flexible printed circuit is configured to carry one or more signals in the first signal layer from an IC provided on the first circuit board to be transmitted unamplified through a connector provided on the second circuit board. The IC may include a modem. The IC may be an application processor. The connector provided on the second circuit board may be a USB 3.0 connector. The first signal layer may be separated from the first copper ground plane by a first non-conductive layer formed from a material that comprises a polyimide.

In various examples, fabricating the first signal layer may include providing at least one ground trace adjacent to the one or more traces configured to carry a signal between the first circuit board and the second circuit board.

In one example, the flexible printed circuit is constructed from a plurality of multi-layer components, where adjacent multi-layer components are bonded together by adhesive.

In one example, the flexible printed circuit is adapted to carry a signal in the first signal layer that has a frequency of at least 5 GHz. In another example, the flexible printed circuit is adapted to carry a signal in the first signal layer that has a frequency of between 1 GHz and 5 GHz.

With reference to FIGS. 2, 4 and 7, an apparatus 200, 400 may include an IC device mounted on a first circuit board. In one example, the first circuit board may correspond to the main board 404 of FIG. 4. The IC device may correspond to the application processor and/or modem 202 of FIG. 2 and/or the host device 402 of FIG. 4. The apparatus 200, 400 may include a connector mounted on a second circuit board that is physically separate from the first circuit board. The second circuit board may correspond to the be sub-board 412 of FIG. 4. The connector may correspond to the USB connector 204, 414 illustrated in FIGS. 2 and/or 4. The apparatus 200, 400 may include an FPC configured to couple the first circuit board to the second circuit board. The FPC may correspond to the bridging FPC interconnect 206 and/or the FPC bridge 408 of FIG. 4.

In one example, the FPC includes a first signal layer fabricated from a planar conductive material and having one or more traces formed therein each configured to carry one or more signals 706 (see FIG. 7) transmitted by the integrated circuit device to the connector, a first non-conductive layer disposed in a plane above the first signal layer, a second non-conductive layer disposed in a plane below the first signal layer, a first copper ground plane disposed in a plane above the first non-conductive layer, a second copper ground plane disposed in a plane below the second non-conductive layer, and a second signal layer provided in a plane above the first copper ground plane or below the second copper ground plane. The one or more signals 706 carried in the first signal layer may include higher frequency components than signals carried in the second signal layer. The one or more signals 706 carried in the first signal layer may be transmitted unamplified through the connector.

The first non-conductive layer may be formed from a material that comprises a polyimide. The second signal layer may be provided in a plane above the first copper ground plane and separated from the first copper ground plane by a third non-conductive layer formed from a material that comprises a polyimide. The FPC may be constructed from a plurality of multi-layer components, where adjacent multi-layer components are bonded together by adhesive.

In one example, the FPC may be adapted to carry a signal in the first signal layer that has a frequency of at least 5 GHz. In another example, the flexible printed circuit is adapted to carry a signal in the first signal layer that has a frequency of between 1 GHz and 5 GHz.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A flexible printed circuit, comprising:
 a first signal layer fabricated from a planar conductive material and having one or more traces formed therein, wherein each of the one or more traces in the first signal layer is configured to carry a signal between a first circuit board and a second circuit board, and wherein each of the one or more traces are provided between traces coupled to at least one of ground and a power supply;
 a second signal layer carrying one or more signals;
 a pair of ground planes positioned and configured to reduce electromagnetic interference induced by one or more signals carried in the first signal layer in a signal carried in the second signal layer when the one or more signals carried in the first signal layer include higher frequency components than the signal carried in the second signal layer;
 a first non-conductive layer disposed in a plane above the first signal layer, wherein a first copper ground plane in the pair of ground planes is disposed in a plane above the first non-conductive layer;
 a second non-conductive layer disposed in a plane below the first signal layer, wherein a second copper ground plane in the pair of ground planes is disposed in a plane below the second non-conductive layer, and wherein the second signal layer is provided in a plane above the first copper ground plane or below the second copper ground plane;
 a first polyimide layer above the second signal layer; and
 a second polyimide layer below the second copper ground plane, wherein the first polyimide layer and the second polyimide layer form the outermost top and bottom layers of the flexible printed circuit, respectively.

2. The flexible printed circuit of claim 1, wherein one or more signals carried in the first signal layer are sourced from an integrated circuit provided on the first circuit board and transmitted unamplified through a connector provided on the second circuit board.

3. The flexible printed circuit of claim 2, wherein the integrated circuit comprises a modem.

4. The flexible printed circuit of claim 2, wherein the integrated circuit comprises an application processor.

5. The flexible printed circuit of claim 2, wherein the connector provided on the second circuit board comprises a universal serial bus connector.

6. The flexible printed circuit of claim 2, wherein the first non-conductive layer is formed from a material that comprises a polyimide.

7. The flexible printed circuit of claim 2, wherein the second signal layer is provided in a plane above the first copper ground plane and separated from the first copper ground plane by a third non-conductive layer formed from a material that comprises a polyimide.

8. The flexible printed circuit of claim 1, wherein the flexible printed circuit is constructed from a plurality of multi-layer components, where adjacent multi-layer components are bonded together by adhesive.

9. The flexible printed circuit of claim 1, wherein the first signal layer carries a signal having a frequency of at least 5 GHz.

10. The flexible printed circuit of claim 1, wherein the first signal layer carries a signal having a frequency of between 1 GHz and 5 GHz.

11. The flexible printed circuit of claim 1, wherein the pair of ground planes is positioned and configured to obtain a reduced capacitance per unit length of the one or more traces.

12. The flexible printed circuit of claim 1, wherein the pair of ground planes is positioned and configured to obtain a reduced admittance per unit length of the one or more traces.

13. An apparatus comprising:
an integrated circuit device mounted on a first circuit board;
a connector mounted on a second circuit board that is physically separate from the first circuit board; and
a flexible printed circuit configured to couple the first circuit board to the second circuit board,
wherein the flexible printed circuit includes:
a first signal layer fabricated from a planar conductive material and having one or more traces formed therein each configured to carry one or more signals transmitted by the integrated circuit device to the connector, and wherein each of the one or more traces are provided between traces coupled to at least one of ground and a power supply;
a first non-conductive layer disposed in a plane above the first signal layer; a second non-conductive layer disposed in a plane below the first signal layer;
a first copper ground plane disposed in a plane above the first non-conductive layer;
a second copper ground plane disposed in a plane below the second non-conductive layer; and
a second signal layer provided in a plane above the first copper ground plane or below the second copper ground plane,
wherein the one or more signals carried in the first signal layer include higher frequency components than signals carried in the second signal layer;
a first polyimide layer above the second signal layer; and
a second polyimide layer below the second copper ground plane, wherein the first polyimide layer and the second polyimide layer form the outermost top and bottom layers of the flexible printed circuit, respectively.

14. The flexible printed circuit of claim 13, wherein the one or more signals carried in the first signal layer are transmitted unamplified through the connector.

15. The flexible printed circuit of claim 13, wherein the integrated circuit device comprises a modem.

16. The flexible printed circuit of claim 13, wherein the integrated circuit device comprises an application processor.

17. The flexible printed circuit of claim 13, wherein the connector comprises a universal serial bus connector.

18. The flexible printed circuit of claim 13, wherein the first non-conductive layer is formed from a material that comprises a polyimide.

19. The flexible printed circuit of claim 13, wherein the second signal layer is provided in a plane above the first copper ground plane and separated from the first copper ground plane by a third non-conductive layer formed from a material that comprises a polyimide.

20. The flexible printed circuit of claim 13, wherein the flexible printed circuit is constructed from a plurality of multi-layer components, where adjacent multi-layer components are bonded together by adhesive.

21. The flexible printed circuit of claim 13, wherein the first signal layer carries a signal having a frequency of at least 5 GHz.

22. The flexible printed circuit of claim 13, wherein the first signal layer carries a signal having a frequency of at least 1 GHz.

* * * * *